United States Patent
Liang et al.

(10) Patent No.: US 6,181,542 B1
(45) Date of Patent: Jan. 30, 2001

(54) METHOD OF MAKING A STACK-POLYSILICON CAPACITOR-COUPLED DUAL POWER SUPPLY INPUT/OUTPUT PROTECTION CIRCUIT

(75) Inventors: Mong-Song Liang, Hsin-Chu; Shyh-Chyi Wong, Taichung, both of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/216,824

(22) Filed: Dec. 21, 1998

(51) Int. Cl.[7] .................................................... H02H 3/00
(52) U.S. Cl. ......................... 361/111; 361/56; 361/118; 361/119
(58) Field of Search .......................... 361/56, 58, 111, 361/113, 117, 118, 91.1, 119

(56) References Cited

U.S. PATENT DOCUMENTS

| 5,631,793 | 5/1997 | Ker et al. | 361/56 |
| 5,671,111 | 9/1997 | Chen | 361/56 |
| 5,721,656 | 2/1998 | Wu et al. | 361/56 |

*Primary Examiner*—Stephen W. Jackson
(74) *Attorney, Agent, or Firm*—George O. Saile; Stephen B. Ackerman; Billy J. Knowles

(57) ABSTRACT

An interface buffer circuit connected at an interface of circuits having a high voltage power supply and circuits having a low voltage power supply, prevents damage due to application of the high voltage power supply to the output terminal of the interface buffer circuit. The interface buffer circuit has a predriver circuit and an interface buffer circuit. The interface buffer circuit has an interface buffer protection circuit. The interface buffer protection circuit consists of an inverter circuit. The inverter circuit has an input connected to the input of the interface driver circuit and an output connected to the gate of a MOS transistor. The source of the MOS transistor is connected to the predriver circuit to control the output of the predriver circuit. The interface buffer protection circuit further has a coupling capacitor connected to interface driver circuit. When a voltage level at the output of the interface driver circuit approaches that of the high voltage power supply, a voltage level input of the inverter causes the output of the inverter circuit to assume a voltage level that will turn off the MOS transistor capturing the voltage level at the input of the interface driver circuit to prevent damage.

12 Claims, 8 Drawing Sheets

FIG. 1 – Prior Art

METHOD OF MAKING A STACK-POLYSILICON CAPACITOR-COUPLED DUAL POWER SUPPLY INPUT/OUTPUT PROTECTION CIRCUIT

BACKGROUND OF THE INVENTION

1. Field of the Invention

This invention generally relates to dual power supply input/output circuits that are at an interface of circuits having a low voltage power supply and circuits having a high voltage power supply. More particularly, this invention relates to circuits or subcircuits that will protect the input/output circuits from damage due to improper exposure to the high voltage power supply.

2. Description of the Related Art

An interface buffer circuit as shown in FIG. 1 is well understood by those skilled in the art. The n-channel Metal Oxide Semiconductor (MOS) driver transistor M1 has a source connected to the substrate biasing voltage source (VSS). The substrate biasing voltage source (VSS) is also often a ground reference point. The drain of the n-channel MOS driver transistor M1 is connected to the input/output pad to transfer signals from circuits having a low voltage power supply VDDL to circuits having a high voltage power supply VDDH.

The p-channel MOS driver transistor M2 has a source connected to an input/output power supply voltage source VDDI/O. The input/output power supply voltage source VDDI/O may be the low voltage power supply VDDL, the high voltage power supply VDDH, or a low voltage isolated power supply that is separate from the low voltage power supply VDDL connected to the internal circuits. The p-channel MOS driver transistor M2 further has a drain connected to the input/output pad.

The voltage level VI/O at the drains of the n-channel and the p-channel MOS driver transistors M1 and M2 will be at the voltage level approaching that of the substrate biasing voltage source VSS, when the voltage level at the gate of the n-channel MOS driver transistor M1 is at a voltage level of the low voltage power supply VDDL. The voltage level VI/O at the drains of the n-channel and the p-channel MOS driver transistor M1 and M2 will be at the voltage approaching that of the input/output power supply VDDI/O, when the voltage level at the gate of the p-channel MOS driver transistor M2 is at a voltage level approaching that of the substrate biasing voltage source VSS.

The source of the n-channel MOS transistor M5 is connected to the substrate biasing voltage source VSS. The source of the p-channel MOS transistor M7 is connected to the low voltage power supply VDDL.

The gates of the n-channel and the p-channel MOS transistor M5 and M7 are connected to the input terminal VIN. The input terminal VIN transfers the signals from the circuits having the low voltage power supply VDDL.

The drains of the n-channel and p-channel MOS transistor M5 and M7 are connected to the gates of the n-channel and p-channel MOS driver transistors M1 and M2. The voltage level V1 will approach that of the substrate biasing voltage source VSS, when the input terminal VIN and thus the gates of the n-channel and p-channel MOS transistors M5 and M7 are at a voltage level approaching that of the low voltage power supply VDDL. The voltage level V1 will approach that of the low voltage power supply VDDL, when the input terminal and thus the gates of the n-channel and p-channel MOS transistors M5 and M7 are at a voltage level approaching that of the substrate biasing voltage source VSS.

The n-channel and p-channel MOS transistors M5 and M7 form the predriver circuit PDrv. The n-channel and p-channel MOS driver transistors M1 and M2 form the interface driver circuit IDrv.

If the design of the n-channel MOS driver transistor M1 is such that the gate oxide deposited over the channel that is between the implanted n-type source and drain has a thickness equivalent to that of the circuits having the low voltage power supply and the voltage level VI/O at the drain of the n-channel MOS driver transistor M1 is approaching that of the high voltage power supply VDDH, the voltage field across the gate oxide can cause damage to the gate oxide. The voltage level VI/O can reach the high voltage higher voltage levels due to ground bounce due to reflections or mismatching of the termination structure.

It will be understood by those skilled in the art, that the voltage level VI/O at the drain of the n-channel MOS driver transistor M1 is determined by the termination structure of external circuitry connected to the input/output pad. It is possible that under certain termination configurations, the voltage level VI/O may equal twice the voltage level of the input/output power supply voltage source VDDI/O.

While the description as presented in FIG. 1 is for a "single ended" transmission scheme, it will further be apparent to those skilled in the art that a predriver PDrv can control the gate of the n-channel MOS driver transistor M1 and a separate predriver circuit PDrv2 (not shown) can control the gate of the p-channel MOS driver transistor M2. This configuration as a "tri-state buffer", connected with a receiver circuit, allows, circuit to function on a bi-directional bus structure that is well known in the art.

With both the n-channel MOS driver transistor M1 and the p-channel MOS driver transistor M2 turned off, the voltage level VI/O can reach a voltage level that is also twice that of the input/output power supply voltage source VDDI/O. Again, it is apparent that with the voltage level VI/O at a large level, the voltage field across the gate oxide of the n-channel MOS driver transistor M1 will cause damage to the gate oxide as described above.

U.S. Pat. No. 5,721,656 (Wu et al.) describes an electrostatic discharge protection network which diverts ESD stress arising between any two contact pads of an IC device, in order to prevent damage to the internal circuitry of the IC device. An ESD discharge bus is arranged around the periphery of an IC chip. Between each IC pad and the discharge bus, there is a protection circuit to directly bypass an ESD stress arising at any two IC pads. Each ESD protection circuit includes a diode, a thick-oxide device, a resistor, and a capacitor. The protection circuit is operated in snapback mode without causing breakdown. Therefore, the triggering voltage of the ESD protection circuit is lowered to the level of the snapback voltage but not to the level of the breakdown voltage.

U.S. Pat. No. 5,671,111 (Chen) teaches an electrostatic discharge (ESD) protection circuitry with a gate-capacitor-coupled device and a silicon controlled rectifier (SCR) coupled to an output of an output device in a sub micron metal oxide semiconductor circuit is disclosed. The gate-capacitor-coupled device has a lower ESD breakdown voltage than an output device, hence, the gate-capacitor-coupled device breaks down and causes the SCR to breakdown when a destructive ESD voltage impinges on the output of the output device. The SCR upon breaking down, discharges the destructive ESD to the power supply bus VDD or VSS.

U.S. Pat. No. 5,631,793 (Ker) is related to a capacitor-couple electrostatic discharge (ESD) protection circuit for protecting an internal circuit and/or an output buffer of an IC from being damaged by an ESD current. The capacitor-couple ESD protection circuit according to the present invention includes an ESD bypass device for bypassing the ESD current, a capacitor-couple circuit for coupling a portion of voltage to the ESD bypass device, and a potential leveling device for keeping an ESD voltage transmitted for the internal circuit at a low potential level. By using the ESD protection circuit of Ker, the snapback breakdown voltage can be lowered to protect the very thin gate oxide of the internal circuit especially in the submicron CMOS technologies.

SUMMARY OF THE INVENTION

An object of this invention is the prevention of damage to an interface buffer circuit due to application of a high voltage power supply to the output terminal of the interface buffer circuit.

Another object of this invention is to provide an interface buffer circuit that is immune to damage from the application of the high voltage power supply to the output terminal of the interface buffer circuit. The damage generally being a breakdown of the gate oxide of MOS driver transistors of the interface buffer circuit.

To accomplish these and other objects, an interface buffer circuit with an interface buffer protection circuit is formed on a semiconductor substrate. The interface buffer circuit is connected at an interface of circuits having a high power supply voltage source and circuits having a low power supply voltage source. The interface buffer circuit has an input terminal connected to the circuits having the low power supply voltage source to transfer signals from the circuits having the low power supply voltage, and an output terminal connected to the circuits having the high power supply voltage source to transfer signals to the circuits having the high power supply voltage source. The interface buffer circuit has a predriver circuit. The predriver circuit has a first MOS transistor of a first conductivity type (such as an n-channel MOS transistor) having a gate connected to the input terminal and a source connected to a substrate biasing voltage source. The predriver circuit further has a second MOS transistor of a second conductivity type (such as a p-channel MOS transistor) having a gate connected to the input terminal, and a source connected to low power supply voltage source. The interface buffer circuit has an interface driver circuit with a first MOS driver transistor of the first conductivity type. The first MOS driver transistor has a gate connected to drains of the second MOS transistor of the predriver circuit, a source connected to the substrate biasing voltage source, and a drain connected to the output terminal, and. The interface driver circuit additionally has a second MOS driver transistor of the second conductivity type. The second MOS driver transistor has a gate connected to the drains of the second transistors of the predriver circuit, a source connected to an input/output power supply voltage source, and a drain connected to the output terminal.

Additionally, the interface buffer circuit has an interface buffer protection circuit. The interface buffer protection circuit consists firstly, of an inverter circuit. The inverter circuit has an input connected to the gates of the first and second MOS driver transistors of the interface driver circuit and an output. The output of the inverter is connected to the gate of a third MOS transistor of the first conductivity type within the interface buffer protection circuit. The source of the third MOS transistor is connected to a drain of the first MOS transistor of the predriver circuit, and the drain of the third MOS transistor is connected to the drain of the second MOS transistor of the predriver circuit. The interface buffer protection circuit finally has a coupling capacitor connected between the drain of the first MOS driver transistor and the gate of the first MOS driver transistor.

When a voltage level at the drain of first MOS driver transistor approaches that of the high power supply voltage source, a voltage level at the gate of the first MOS driver transistor that is approximately one half of the voltage level of the high power supply voltage source, causes the output inverter circuit to assume a voltage level that will turn off the third MOS transistor capturing the voltage level at the gate of the third MOS transistor to prevent damage to the first and second MOS driver transistors. The voltage level at the drain of the first MOS driver transistor will approach that of the high power supply voltage source is a result of reflection induced ground bounce or reflection due to mismatch of the termination that can double the voltage level of the low power supply voltage source.

The voltage level at the inverter will cause the inverter circuit to switch to a voltage level sufficient to turn off the third MOS transistor is from a logic threshold voltage that is greater than one half that of the low power supply voltage source to a voltage level that is less than one half that of the high power supply voltage source.

The gate of the first MOS driver transistor is a first polysilicon layer formed on a gate oxide deposited on the surface of the semiconductor substrate. This also forms the first plate of the coupling capacitor. An insulating layer is deposited on the first polysilicon layer and a second plate of the coupling capacitor is formed by depositing a second polysilicon layer on the insulating layer and connected to the drain of the first MOS driver transistor.

DETAILED DESCRIPTION OF THE INVENTION

Figure 1:
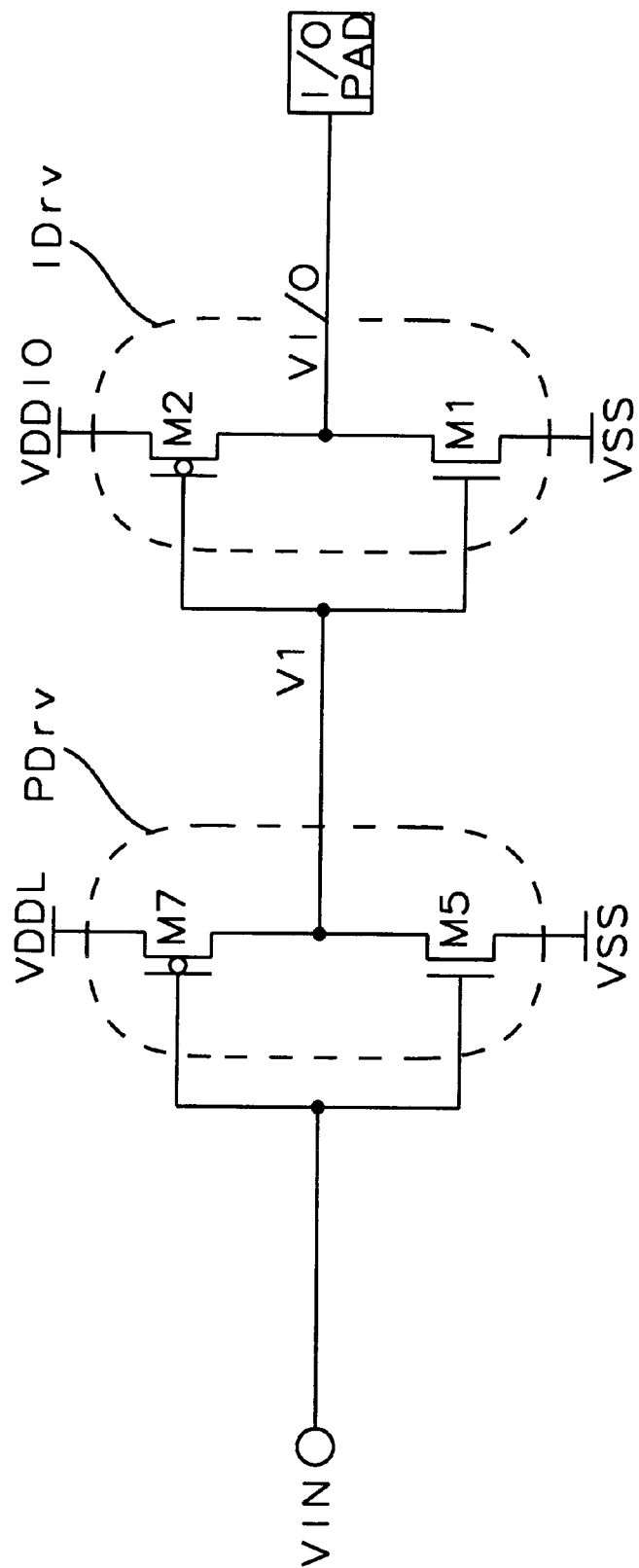
FIG. 1 is a schematic drawing of an interface buffer circuit of the prior art.
Figure 2:
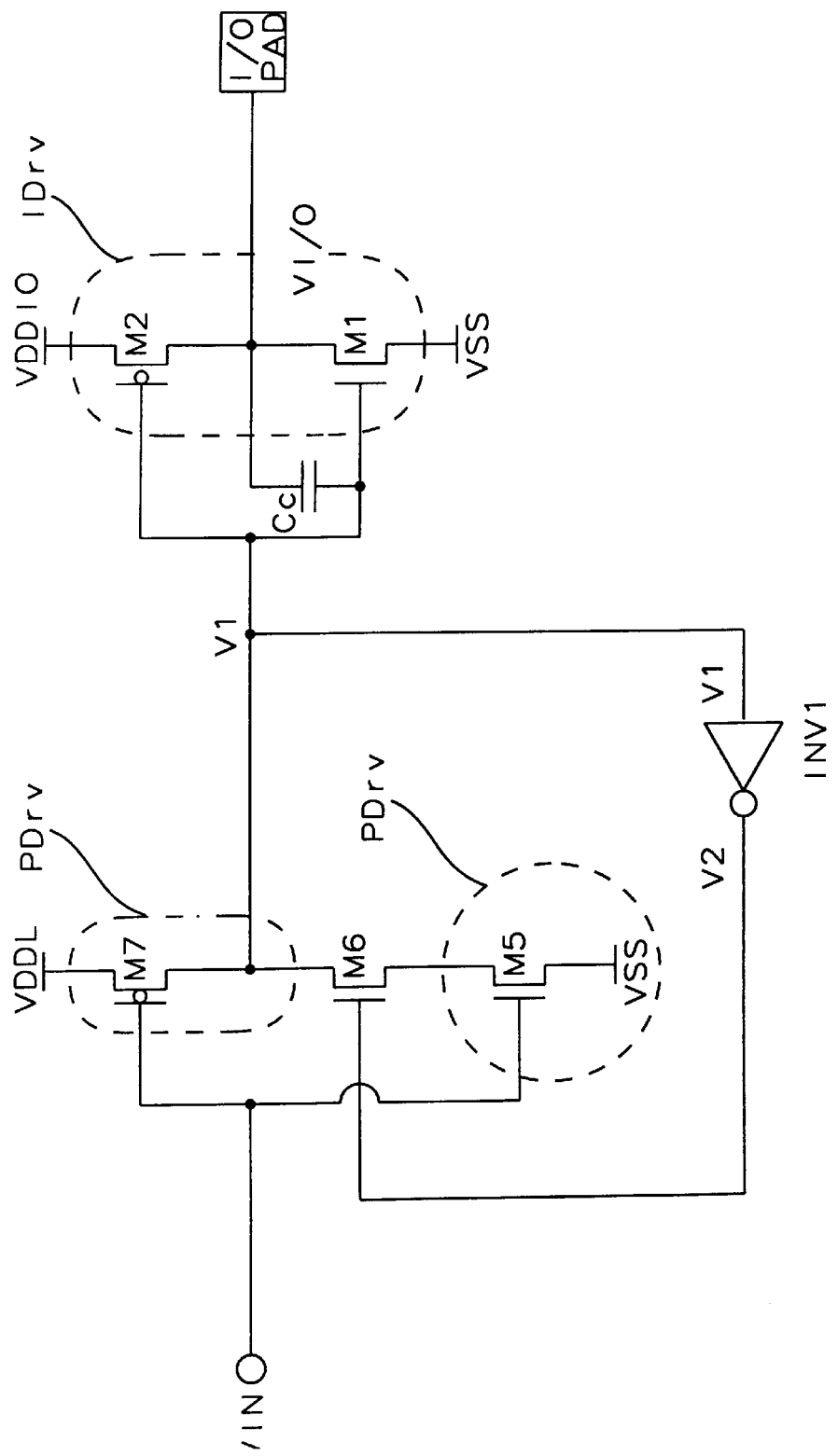
FIG. 2 is a schematic of the interface buffer circuit with the interface buffer protection circuit of this invention.

FIG. 2 illustrates an interface buffer with a buffer protection circuit of this invention. The interface driver IDrv, consisting of the n-channel and p-channel MOS transistors, is as described in FIG. 1. The predriver circuit PDrv consists of the n-channel and p-channel MOS transistors M5 and M7. The input VIN is connected to the gates of the n-channel and p-channel MOS transistors M5 and M7 to transfer signals from the circuits having the low voltage power supply as shown in FIG. 1.

The interface buffer protection circuit has a coupling capacitor Cc connected from the drain to the gate of the n-channel MOS driver transistor M1. The interface protection circuit further has the n-channel MOS transistor M6 that is inserted between the drains of the n-channel and p-channel MOS transistors M5 and M7. The source of the n-channel MOS transistor M6 is connected to the drain of the n-channel MOS transistor M5 and the drain of the n-channel MOS transistor M6 is connected to the drain of the p-channel MOS transistor M7.

Finally, the interface protection circuit has an inverter circuit INV1. The input of the inverter circuit is connected to the gates of the n-channel and p-channel MOS driver transistors M1 and M2 and to the first plate of the coupling capacitor Cc. The output of the inverter circuit INV1 is connected to the gate of the n-channel MOS transistor M6.

Figure 3:
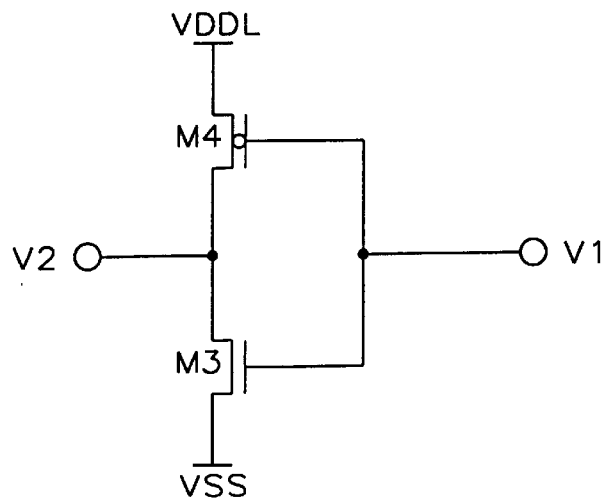
FIG. 3 is a schematic diagram of the inverter circuit of the interface buffer protection circuit of this invention.

Refer now to FIG. 3 for a discussion of the inverter INV1. The inverter INV1 has an n-channel MOS transistor M3 with a source connected to the substrate biasing voltage source VSS and a p-channel MOS transistor M4 with a source connected to the low voltage power supply VDDL. The gates of the n-channel and p-channel MOS transistors M3 and M4 form the input of the inverter circuit INV1 that is connected to the gates of the n-channel and p-channel MOS driver transistors M1 and M2 of FIG. 2. The drains of the n-channel and p-channel MOS transistors M3 and M4 are connected together to form the output of the inverter circuit INV1 that is connected to the gate of the n-channel MOS transistor M6.

Figure 4:
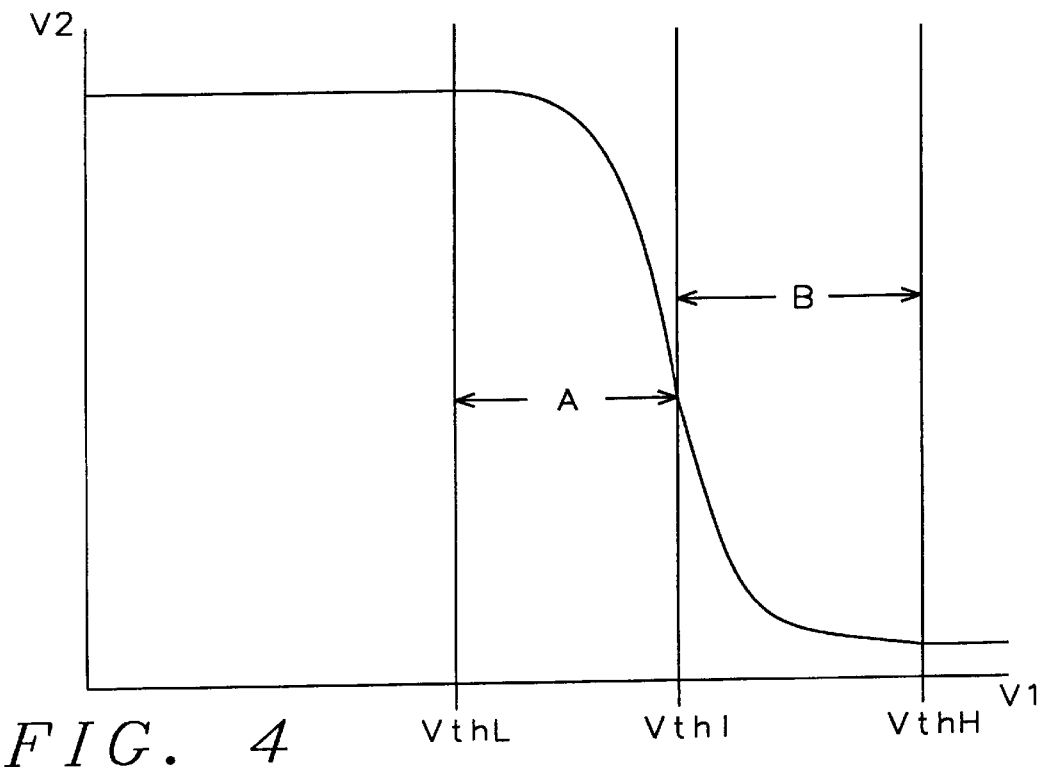
FIG. 4 is a graphical plot of the input voltage versus the output voltage of the inverter circuit of FIG. 3, illustrating the threshold voltage of the inverter circuit.

The threshold Vthi of the inverter is adjusted to reflect the graphical plot of FIG. 4. FIG. 4 is a plot of the voltage level V2 of the inverter INV1 versus the voltage level of the input of the inverter INV1. As the voltage level V1 of the input of the inverter INV1 increases from approximately the voltage level of the substrate biasing voltage source VSS (approximately 0V), the voltage level V2 of the output of the inverter INV1 will be at approximately the voltage level of the low voltage power supply VDDL. When the voltage level V, of the input of the inverter INV1 reaches the threshold voltage level Vthi, the voltage level V2 of the output of the inverter INV1 will change to a voltage level that is approximately the voltage level of the substrate biasing voltage source (approximately 0V).

The threshold voltage level Vthi is between the low threshold voltage level VthL and the high threshold voltage level VthH. The low threshold voltage level VthL is approximately one half that of the low voltage power supply VDDL. The high threshold voltage level VthH is approximately one half that of the high voltage power supply VDDH. The low differential voltage level A of the threshold voltage level Vthi from the low threshold voltage level VthL is from approximately 0.05V to approximately 2.0V greater than the low threshold voltage level VthL. The high differential voltage B of the threshold voltage level Vthi from the high threshold voltage level VthH is from approximately 2.0V to approximately 0.05V less than the high threshold voltage level VthH.

Refer now back to FIG. 2 for an explanation of the operation of the interface buffer protection circuit of this invention. If the input/output power supply voltage source VDDI/O is at the voltage level of the low voltage power supply VDDL and the voltage level VIN of the input terminal is at a voltage level approaching that of the substrate biasing voltage source VSS, the output of the predriver PDrv is at a voltage level approaching that of the low voltage power supply VDDL. The voltage level at the I/O pad is approaching that of the substrate biasing voltage source VSS. The voltage level V1 at the input of the inverter INV1 will be approaching that of the low voltage power supply and consequently, the voltage level V2 of the output of the inverter INV1 will be approaching that of the substrate biasing voltage VSS. This makes the n-channel MOS transistor M5 and the drain of the n-channel MOS transistor M6 turned off and the p-channel MOS transistor M7 turned on. This mode of operation is equivalent to the normal operation of the buffer circuit as described in FIG. 1 when the input voltage VIN is equal to the level of the substrate biasing voltage source VSS.

If the voltage level VIN of the input terminal is approaching that of the low voltage power supply VDDL, and the input/output power supply voltage source VDDI/O is at the voltage level of the low voltage power supply VDDL, the voltage level of the output of the predriver is approaching that of the level of the substrate biasing voltage source VSS. The voltage level VI/O of the I/O pad is approaching that of the level of the substrate biasing voltage source VSS. Since the voltage level V1 of the input of inverter INV1 is approaching that of the level of the low voltage power supply VDDL, the voltage level V2 of the output of the inverter INV1 is approaching that of the substrate biasing voltage source VSS, thus turning off the n-channel MOS transistor M6. The above describes the "normal" operation of the interface buffer protection circuit with the input voltage level VIN equal to the low voltage power supply VDDL.

The interface buffer protection circuit enters its "protective" operation when the voltage level VI/O at the I/O pad is brought externally to that of the high voltage power supply VDDH.

As the voltage level VI/O increases toward the high voltage power supply VDDH, the voltage is coupled to the gates of the n-channel and p-channel MOS transistors M1 and M2. The voltage level V1 will increase to a level greater than one half that of the high voltage power supply VDDH. The voltage level V2 at the output of the inverter INV1 will approach that of the substrate biasing voltage source VSS, thus turning off the n-channel MOS transistor M6. Turning off the n-channel MOS transistor M6 will prevent the voltage level V1 from changing to a voltage level approaching that of the substrate biasing voltage source VSS, as the voltage level VIN at the input terminal is brought to a voltage level approaching that of the low voltage power supply VDDL. This prevents the voltage field across gate oxide of the n-channel MOS driver transistor M1 from causing damage to the gate oxide of the n-channel MOS driver transistor M1.

The n-channel MOS driver transistor M1 can be partially turned on and thus act as a resistor. However, the voltage level VI/O present at the input/output pad will not change, but with the gate to drain voltage level of the n-channel MOS driver transistor M1 less than the voltage level of the low voltage power VDDL, the voltage field across gate oxide of the n-channel MOS driver transistor M1 does not cause damage to the gate oxide of the n-channel MOS driver transistor M1.

It will be apparent to those skilled in the art that the interface buffer protection circuit can be applied to tri-state or bidirectional circuits described above.

Figure 5:
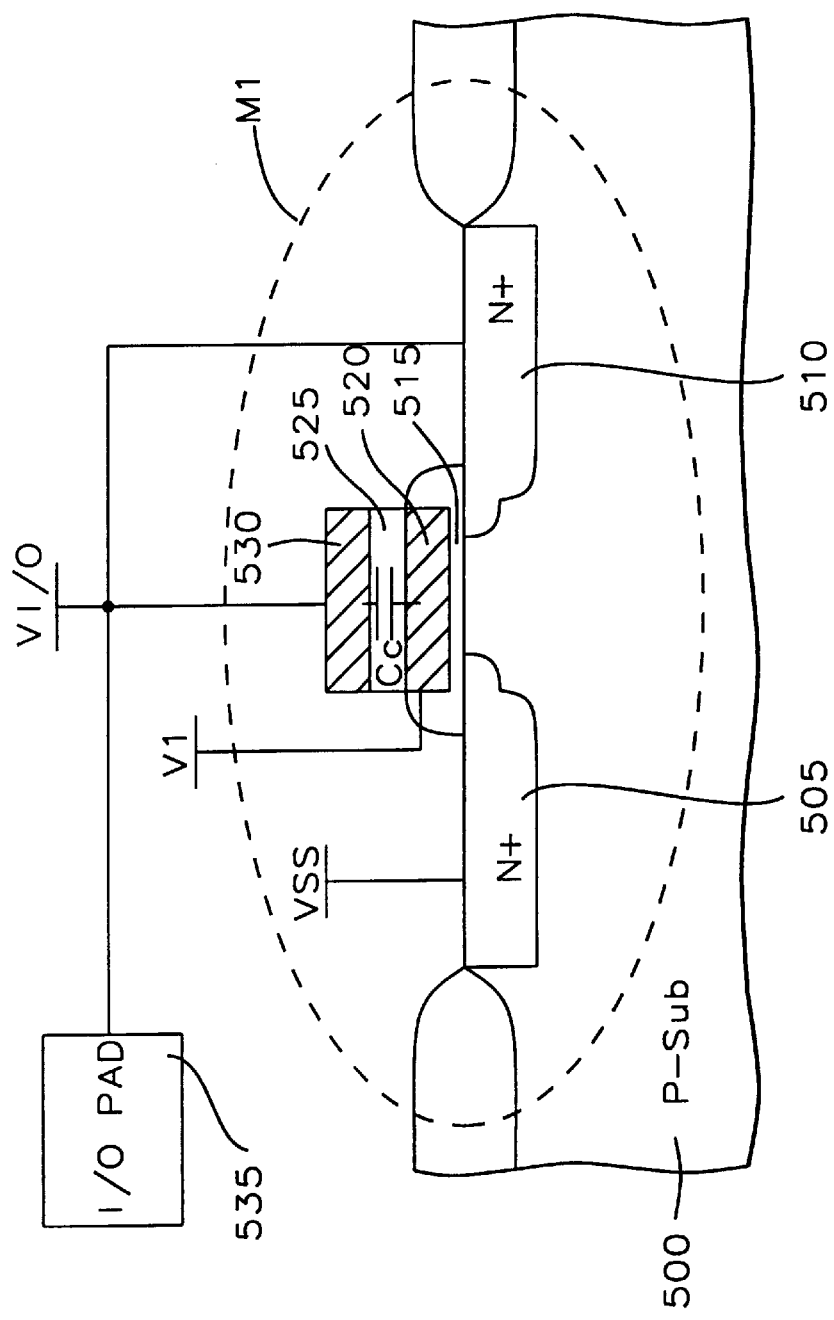
FIG. 5 is a cross sectional diagram of the n-channel MOS driver transistor and the stacked polysilicon coupling capacitor of the interface buffer circuit of this invention.
Figure 6A:
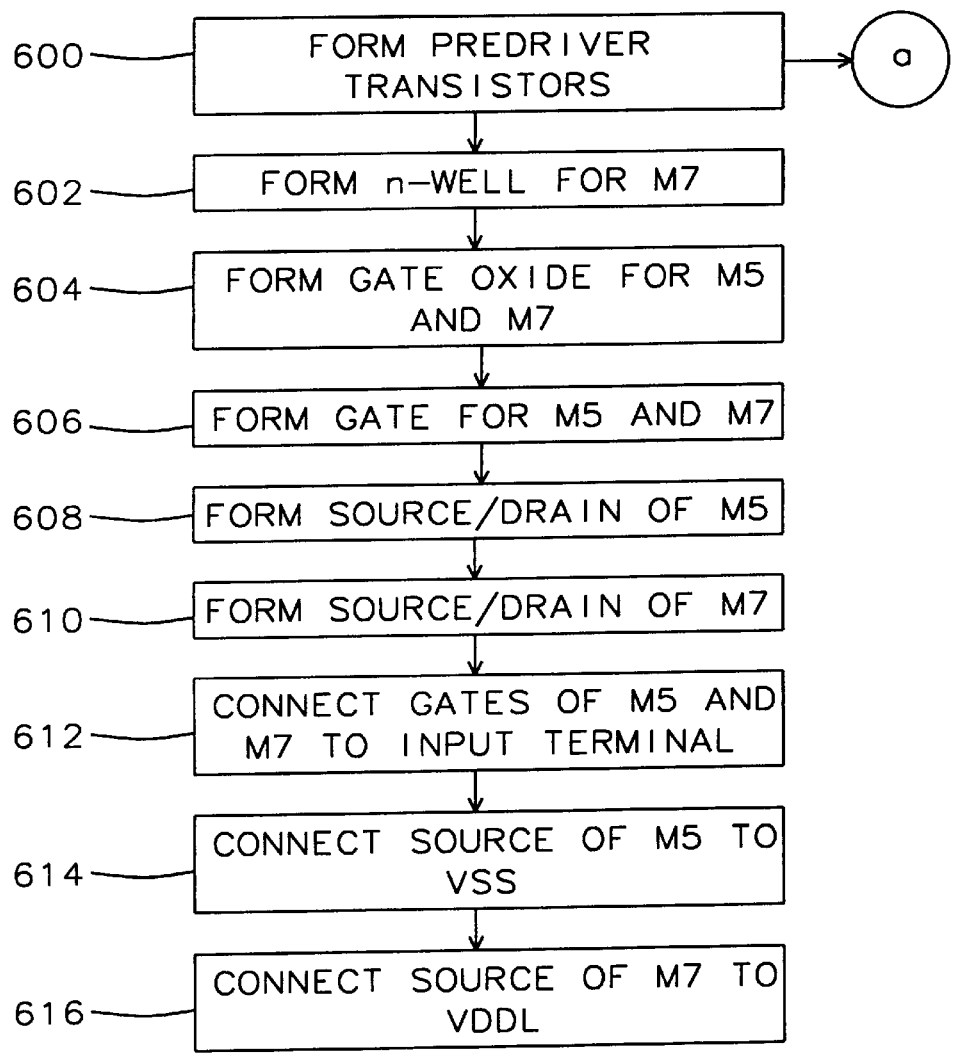
FIGS. 6a, 6b, 6c and 6d are flow charts describing the method of forming an interface buffer circuit with an interface buffer protection circuit of this invention on a semiconductor substrate.
Figure 6B:
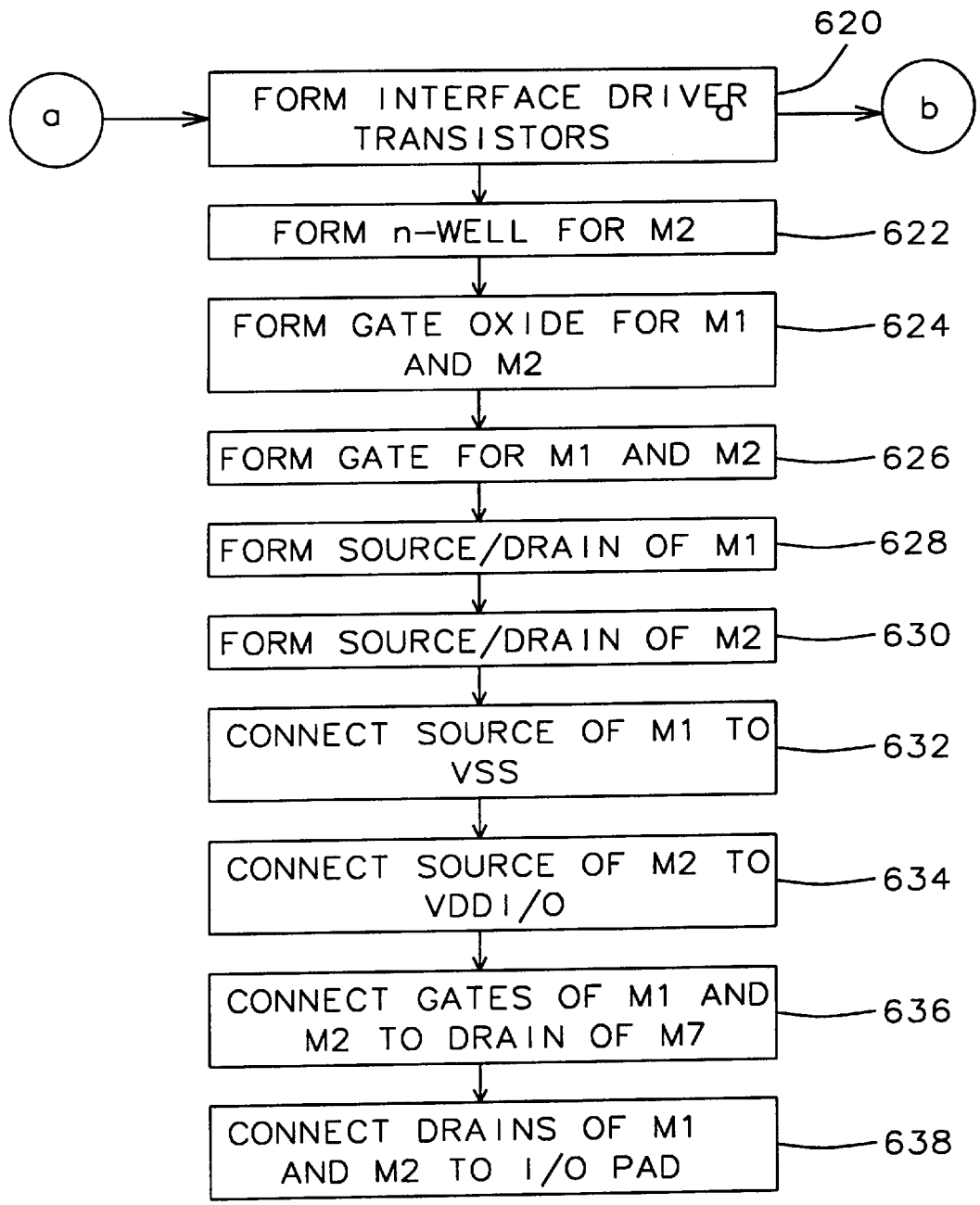
Figure 6C:
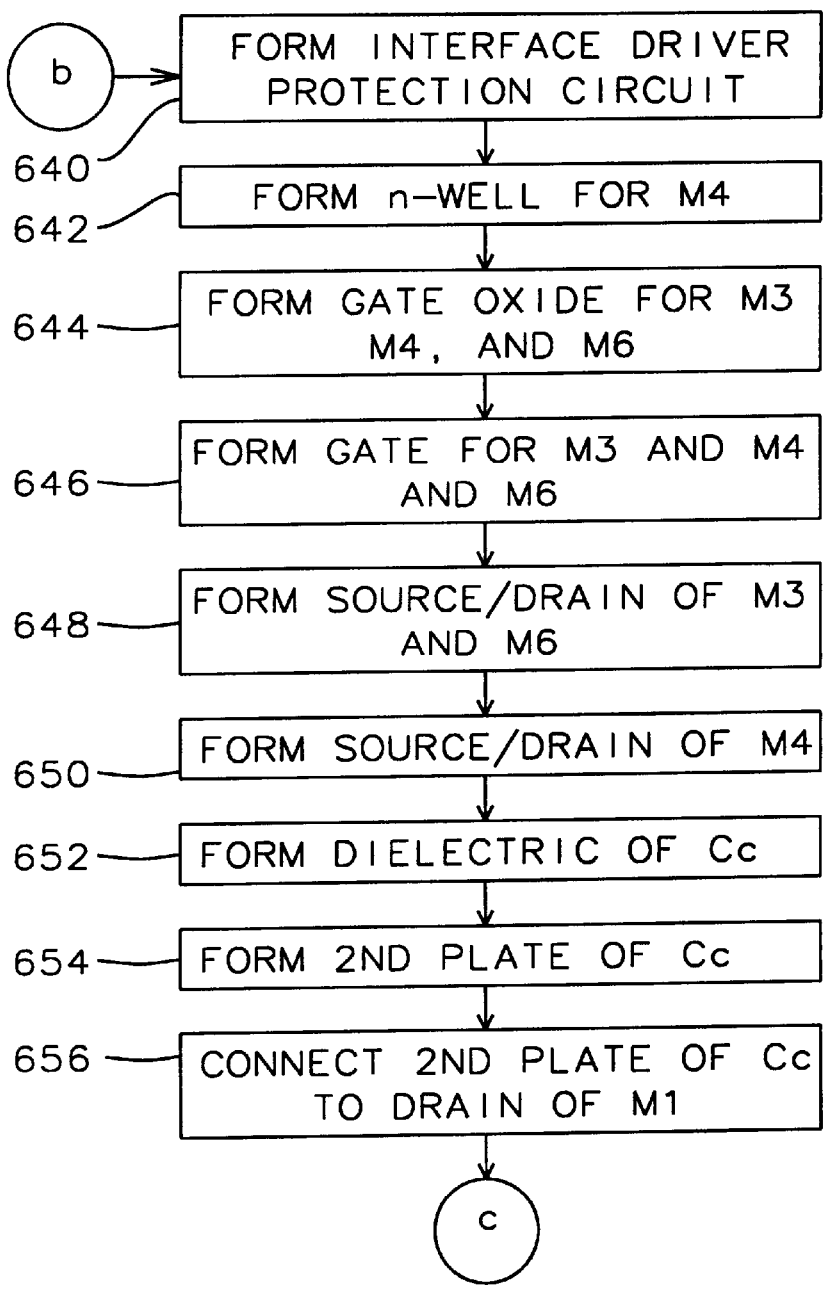
Figure 6D:
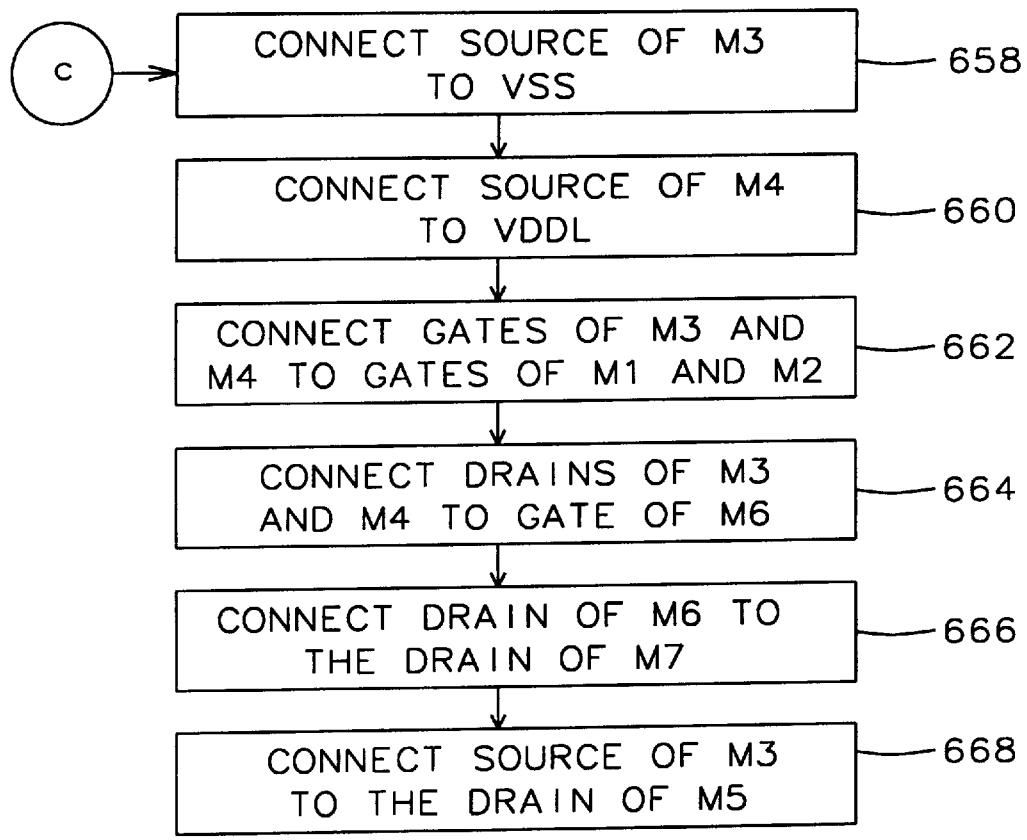

The interface buffer with an interface buffer protection circuit can be constructed on the surface of a semiconductor substrate using techniques known to those skilled in the art. FIG. 5 shows the structure of the coupling capacitor Cc of FIG. 2 as a stacked polysilicon capacitor formed above the n-channel MOS driver transistor M1 The source 505 and drain 510 of the n-channel MOS transistor M1 is formed by implanting an n-type material into the surface of the semiconductor substrate 500. The source 505 and drain 510 has a lightly doped drain (LDD) configuration commonly used in the art. A gate oxide 515 is formed on the surface of the semiconductor substrate 500 above the channel region between the source 505 and the drain 510. A highly doped polysilicon is formed above the gate oxide 515 to create the gate 520 of the n-channel MOS driver transistor M1. The gate 520 is also the first plate of the coupling capacitor Cc. A second layer of insulating material such as that that forms the gate oxide 515 is deposited on the gate 520 to form the dielectric 525 of the coupling capacitor Cc. A second layer of highly doped polysilicon is deposited on the dielectric 525 to form the second plate 530 of the coupling capacitor Cc.

Refer now to FIGS. 6a, 6b, 6c, and 6d for a discussion of the method of the formation of the interface buffer circuit of FIG. 2 on the surface of a semiconductor substrate. The method of formation of the interface buffer circuit is the simultaneously forming 600 the predriver transistors M5 and M7, forming 620 the interface driver transistor M1 and M2, and forming 640 the interface protection circuit (coupling capacitor Cc, inverter INV1, and n-channel MOS transistor M6).

The n-wells for the p-channel MOS transistors M2, M4, and M7 are formed 602, 622, 642 by implanting the n-type material to a lightly doped concentration into the surface of the interface buffer circuit. An insulating material is formed on the surface of the semiconductor substrate above the channel regions between the sources and drains of the transistors M1, M2, M3, M4, M5, M6 and M7 to create 604, 628, 644 the gate oxides of the transistors. A highly doped polysilicon material is deposited on each of the gate oxides to form 606, 636, 646 the gates of the transistors M1, M2, M3, M4, M5, M6 and M7.

The n-type material is further implanted into the surface of the semiconductor substrate to a high concentration to form 608, 628, and 648 the sources and drains of the n-channel MOS transistors M1, M3, M5, and M6. A p-type material is then implanted into the surface of the semiconductor substrate in the area of the n-wells to form 610, 630, and 650 the sources and drains of the p-channel MOS transistors M2, M4, and M7.

The dielectric of the coupling capacitor Cc is formed 652 by depositing a second insulating material on the gate of the n-channel MOS driver transistor M1. The second plate of the coupling capacitor Cc is formed 654 on the dielectric by depositing a second layer of highly doped polysilicon on the dielectric.

The sources of the n-channel MOS transistors M1, M3 and M5 are connected 614, 632, and 658 the substrate biasing voltage source VSS. The sources of the p-channel MOS transistors M4 and M7 are connected 616 and 660 to the low voltage power supply VDDL. The source of the p-channel MOS transistor M2 is connected 634 to the input/output power supply voltage source VDDI/O.

The gates of the n-channel and p-channel transistors M5 and M7 are connected 612 to the input terminal. The gates of the n-channel and p-channel MOS driver transistor M1 and M2 are connected 662 to the drain p-channel MOS transistor M7 and to the gates of the n-channel and p-channel MOS transistors M3 and M4. The drains of the n-channel and p-channel MOS driver transistors M1 and M2 are connected to the I/O pad or output terminal. The drains of the n-channel and p-channel MOS transistors M3 and M4 are connected 664 to the gate of the n-channel MOS transistor M6. The drain of the n-channel MOS transistor M6 is connected 666 to the drain of the p-channel MOS transistor M7 and the source of the n-channel MOS transistor M6 is connected 668 to the drain of the n-channel MOS transistor M5.

While this invention has been particularly shown and described with reference to the preferred embodiments thereof, it will be understood by those skilled in the art that various changes in form and details may be made without departing from the spirit and scope of the invention.

The invention claimed is:

1. A dual power supply interface buffer circuit formed on a semiconduct or substrate to prevent damage to said interface buffer circuit connected at an interface of circuits having a high power supply voltage source and circuits having a low power supply voltage source, comprising:

an input terminal connected to the circuits having the low power supply voltage source to transfer signals from said circuits having the low power supply voltage, an output terminal connected to the circuits having the high power supply voltage source to transfer signals to said circuits having the high power supply voltage source, whereby a voltage level at said output terminal is generated by a ground bounce and a termination mismatch reflection;

a predriver circuit having:
a first MOS transistor of a first conductivity type having a gate connected to the input terminal, and a source connected to a substrate biasing voltage, source, and;
a second MOS transistor of a second conductivity type having a gate connected to the input terminal, and a source connected to low power supply voltage source;

an interface driver circuit having:
a first MOS driver transistor of the first conductivity type having a gate connected to drains of the second MOS transistor of the predriver circuit, a source connected to the substrate biasing voltage source, and a drain connected to the output terminal, and;
a second MOS driver transistor of the second conductivity type having a gate connected to the drains of the second transistors of the predriver circuit, a source connected to an input/output power supply voltage source, and a drain connected to the output terminal;

an interface driver protection circuit comprising:
an inverter circuit having an input connected to the gates of the first and second MOS driver transistors of the interface driver circuit and an output;
a third MOS transistor of the first conductivity type having a gate connected to the input of the inverter circuit, a source connected to a drain of the first MOS transistor of the predriver circuit, and a drain connected to the drain of the second MOS transistor of the predriver circuit; and
a coupling capacitor connected between the drain of the first MOS driver transistor and the gate of the first MOS driver transistor, such that when a voltage level at the drain of first MOS driver transistor that approaches that of the high power supply voltage source, a voltage level at said gate of the first MOS driver transistor causes the output inverter circuit to assume a voltage level that will turn off the third MOS transistor capturing said voltage level at said drain of the third MOS transistor to prevent damage to said first and second MOS driver transistors.

2. The interface buffer circuit of claim 1 wherein the voltage level at the gate of the first MOS driver transistor will cause the inverter circuit to switch to a voltage level sufficient to turn off the third MOS transistor is greater than a logic threshold of the inverter circuit.

3. The buffer interface circuit of claim 1 wherein the gate of the first MOS driver transistor is a first polysilicon layer formed on said semiconductor substrate and the coupling capacitor is formed as having a first plate that is the first polysilicon layer, an insulating layer deposited on said first polysilicon layer and a second plate formed by a second polysilicon layer deposited on the insulating layer and connected to the drain of the first MOS driver transistor.

4. The buffer interface circuit of claim 1 wherein the input/output power supply voltage source is selected is selected from the group of voltage sources including the low power supply voltage source, the high power supply voltage source, and an isolated power supply voltage source having a voltage level equal to that of the low power supply voltage source and isolated from said low power supply voltage source.

5. A dual power supply interface buffer protection circuit to protect an interface buffer circuit at an interface of circuits having a high power supply voltage source and circuits having a low power supply voltage source, whereby said interface buffer circuit comprises:

an input terminal connected to the circuits having the low power supply voltage source to transfer signals from said circuits having the low power supply voltage;

an output terminal connected to the circuits having the high power supply voltage source to transfer signals to said circuits having the high power supply voltage source, whereby a voltage level at said output terminal is generated by a ground bounce and a termination mismatch reflection;

a predriver circuit having:
  a first MOS transistor of a first conductivity type having a gate connected to the input terminal, and a source connected to a substrate biasing voltage source, and;
  a second MOS transistor of a second conductivity type having a gate connected to the input terminal, and a source connected to low power supply voltage source; and an interface driver circuit having:
  a first MOS driver transistor of the first conductivity type having a gate connected to drains of the second MOS transistor of the predriver circuit, a source connected to the substrate biasing voltage source, and a drain connected to the output terminal, and;
  a second MOS driver transistor of the second conductivity type having a gate connected to the drains of the second transistors of the predriver circuit, a source connected to an input/output power supply voltage source, and a drain connected to the output terminal;

and whereby said interface driver protection circuit is comprising:
  an inverter circuit having an input connected to the gates of the first and second MOS driver transistors of the interface driver circuit and an output;
  a third MOS transistor of the first conductivity type having a gate connected to the output of the inverter circuit, a source connected to a drain of the first MOS transistor of the predriver circuit, and a drain connected to the drain of the second MOS transistor of the predriver circuit; and a coupling capacitor connected between the drain of the first MOS driver transistor and the gate of the first MOS driver transistor, such that when a voltage level at the drain of first MOS driver transistor that approaches that of the high power supply voltage source, a voltage level at said gate of the first MOS driver transistor causes the output inverter circuit to assume a voltage level that will turn off the third MOS transistor capturing said voltage level at said drain of the third MOS transistor to prevent damage to said first and second MOS driver transistors.

6. The interface protection buffer circuit of claim 5 wherein the voltage level at the gate of the first MOS driver transistor will cause the inverter circuit to switch to a voltage level sufficient to turn off the third MOS transistor is greater than a logic threshold voltage of said inverter circuit.

7. The interface protection buffer circuit of claim 5 wherein the gate of the first MOS driver transistor is a first polysilicon layer formed on said semiconductor substrate and the coupling capacitor is formed as having a first plate that is the first polysilicon layer, an insulating layer deposited on said first polysilicon layer and a second plate formed by a second polysilicon layer deposited on the insulating layer and connected to the drain of the first MOS driver transistor.

8. The interface protection circuit of claim 5 wherein the input/output power supply voltage source is selected is selected from the group of voltage sources including the low power supply voltage source, the high power supply voltage source, and an isolated power supply voltage source having a voltage level equal to that of the low power supply voltage source and isolated from said low power supply voltage source.

9. A method of forming a capacitor coupled dual power supply input/output buffer protection circuit on a semiconductor substrate to protect an input/output buffer circuit at an interface of circuits having a high power supply voltage source and circuits having a low power supply voltage source from damage when brought in contact with the high power supply voltage source, comprising the steps of:

forming a predriver circuit of said input/output buffer circuit by implanting into a surface of the semiconductor substrate a material of a first conductivity type to form a source and drain of a first MOS transistor and a first well to contain a second MOS transistor, implanting a material of a second conductivity type into the surface of the semiconductor substrate within said first well to form a source and drain of the second MOS transistor, forming a gate oxide by depositing an insulating material on the semiconductor substrate above channel regions between the sources and drains of the first and second MOS transistors, forming gates of the first and second MOS transistors by depositing a conductive material on the gate oxide of the first and second MOS transistors, connecting the source of the first MOS transistor to a substrate biasing voltage source, connecting the source of the second MOS transistor to the low power supply voltage source, and the gates to an input terminal to accept signals from the circuits having the low power supply voltage source;

forming an output driver circuit of said input/output buffer circuit by implanting into the surface of the semiconductor substrate the material of the first conductivity type to form a source and drain of a first MOS driver transistor and a second well to contain a second MOS driver transistor, implanting the material of the second conductivity type into the surface of the semiconductor substrate within said second well to form a source and drain of the second MOS driver transistor, forming a gate oxide by depositing an insulating material on the semiconductor substrate above channel regions between the sources and drains of the first and second MOS driver transistors, forming gates of the first and second MOS driver transistors by depositing the conductive material on the gate oxide of the first and second MOS driver transistors, connecting the source of the first MOS driver transistor to the substrate biasing voltage source, connecting the source of the second MOS driver transistor to an input/output power supply voltage source, connecting the gates of the first and second MOS driver transistors to the drain of the second MOS transistors of the predriver circuit, connecting the drains of the first and second MOS driver transistor to an output terminal to transfer the signals to the circuits having the high power supply voltage source;

forming an inverter circuit having an input connected to the gates of the first and second MOS driver transistors, and an output that will switch from a first voltage level to a second voltage level when the input has a voltage level that is greater than a threshold voltage level of said inverter circuit;

forming a coupling capacitor between the drain and the gate of the first MOS driver transistor, such that when a voltage level at the drain of said first MOS driver approaches that of the high power supply voltage source, a voltage level at said gate of said first MOS driver transistor is greater than the threshold voltage level and the output of the inverter circuit will assume the second voltage level; and forming a third MOS transistor by implanting the material of the first conductivity type into the surface of the semiconductor substrate to form a source and a drain, forming a gate oxide by depositing an insulating material on the surface of the semiconductor substrate channel region between the source and the drain, forming a gate by depositing the conductive material on the gate oxide, connecting the source of the third MOS transistor to the drain of the first MOS transistor, connecting the gate of the third MOS transistor to the output of the inverter circuit, and connecting the drain of the third MOS transistor to the drain of the second MOS transistor, whereby said third MOS transistor will turn off when the output inverter circuit is at the second voltage level.

10. The method of claim 9 wherein the input/output power supply voltage source is selected is selected from the group of voltage sources including the low power supply voltage source, the high power supply voltage source, and an isolated power supply voltage source having a voltage level equal to that of the low power supply voltage source and isolated from said low power supply voltage source.

11. The method of claim 9 wherein the coupling capacitor is formed by placing an insulating layer on the gate of the first MOS driver transistor, that is a first plate of said coupling capacitor, to form a dielectric of said coupling capacitor, depositing the conductive material on the dielectric to form a second plate of said coupling capacitor, and connecting said second plate to the drain of the first MOS driver transistor.

12. The method of claim 9 wherein forming the inverter is comprising the steps of:

implanting into the surface of the semiconductor substrate the material of the first conductivity type to form a source and a drain of a first MOS inverter transistor and a third well to contain a second MOS inverter transistor;

implanting for a second time the material of the second conductivity type to a channel region between the source and the drain of the first MOS inverter transistor to adjust the threshold voltage of said first MOS inverter transistor;

implanting the material of the second conductivity type to form a source and a drain of the second MOS inverter transistor within said third well;

depositing the insulating material to form gate oxides at the surface of the semiconductor substrate between the sources and the drains of the first and second MOS inverter transistors;

depositing the conductive material on the gate oxides of the first and second MOS inverter transistors to create the gates of the first of the second MOS inverter transistors;

connecting the gates of the first and second MOS inverter transistors to the input of the inverter circuit;

connecting the source of the first MOS inverter transistor to the substrate biasing voltage source;

connecting the source of the second MOS inverter transistor to the low power supply voltage source; and connecting the drains of the first and second MOS inverter transistors to the output of the inverter circuit.

* * * * *